United States Patent
Zanati et al.

(10) Patent No.: US 9,369,159 B2
(45) Date of Patent: Jun. 14, 2016

(54) METHOD AND DEVICE FOR PROCESSING SIGNALS BASED ON TRANSMISSION MIXER, FREQUENCY MULTIPLIER, AND SUBHARMONIC MIXING

(75) Inventors: Abdellatif Zanati, München (DE); Andreas Ziroff, München (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 1 day.

(21) Appl. No.: 13/825,960

(22) PCT Filed: Sep. 1, 2011

(86) PCT No.: PCT/EP2011/065129
§ 371 (c)(1),
(2), (4) Date: Apr. 18, 2013

(87) PCT Pub. No.: WO2012/038236
PCT Pub. Date: Mar. 29, 2012

(65) Prior Publication Data
US 2013/0195211 A1    Aug. 1, 2013

(30) Foreign Application Priority Data
Sep. 24, 2010  (DE) .......................... 10 2010 041 372

(51) Int. Cl.
| | |
|---|---|
| *H04B 1/04* | (2006.01) |
| *H01Q 11/12* | (2006.01) |
| *G01S 7/03* | (2006.01) |
| *G01S 13/58* | (2006.01) |
| *H03B 19/16* | (2006.01) |

(52) U.S. Cl.
CPC ... *H04B 1/04* (2013.01); *G01S 7/03* (2013.01); *G01S 13/583* (2013.01); *H03B 19/16* (2013.01)

(58) Field of Classification Search
CPC .......................... H03D 7/1408; H03D 7/1475
USPC .................. 455/326, 330, 118, 119, 112, 323
See application file for complete search history.

(56) References Cited

U.S. PATENT DOCUMENTS

| | | | |
|---|---|---|---|
| 3,076,133 A | | 1/1963 | Holcomb |
| 4,394,632 A | * | 7/1983 | Hu ................................ 333/218 |
| 4,730,169 A | * | 3/1988 | Li ................................ 331/36 C |
| 4,749,949 A | * | 6/1988 | Albin et al. .................... 327/119 |
| 5,231,349 A | * | 7/1993 | Majidi-Ahy et al. ..... 324/754.06 |
| 5,446,923 A | * | 8/1995 | Martinson et al. ............. 455/330 |
| 5,495,255 A | | 2/1996 | Komatsu et al. |
| 5,596,325 A | | 1/1997 | Maas |

(Continued)

FOREIGN PATENT DOCUMENTS

| | | |
|---|---|---|
| CN | 101030757 | 9/2007 |
| DE | 102004048994 A1 | 4/2006 |

OTHER PUBLICATIONS

Office Action dated Jun. 9, 2011 in corresponding German Application No. 102010041372.0.

(Continued)

*Primary Examiner* — Simon Nguyen
(74) *Attorney, Agent, or Firm* — Slayden Grubert Beard PLLC

(57) ABSTRACT

An input signal is routed from a first component to a second component. The second component multiplies the frequency of the received signal by at least one component part with a non-linear characteristic curve.

14 Claims, 3 Drawing Sheets

(56) References Cited

U.S. PATENT DOCUMENTS

| | | | |
|---|---|---|---|
| 5,740,528 A * | 4/1998 | Drennen | 455/327 |
| 5,924,021 A | 7/1999 | Paul et al. | |
| 6,282,413 B1 | 8/2001 | Baltus | |
| 6,473,598 B1 * | 10/2002 | Sepehry-Fard | 455/73 |
| 6,725,029 B1 * | 4/2004 | Allen | H03D 9/0608 |
| | | | 455/296 |
| 6,879,192 B2 * | 4/2005 | Merenda | 327/113 |
| 7,164,902 B2 * | 1/2007 | Yamada et al. | 455/326 |
| 7,606,551 B2 | 10/2009 | Bollenbeck et al. | |
| 8,229,387 B2 * | 7/2012 | Kawakami et al. | 455/326 |
| 8,767,594 B2 * | 7/2014 | Lo Hine Tong et al. | 370/277 |
| 2002/0102958 A1 * | 8/2002 | Buer | 455/296 |
| 2002/0126019 A1 * | 9/2002 | Tatsumi et al. | H03D 9/0633 |
| | | | 340/1.1 |
| 2003/0068996 A1 * | 4/2003 | Setty et al. | 455/313 |
| 2003/0094976 A1 | 5/2003 | Miyashita | |
| 2005/0191985 A1 * | 9/2005 | Bos et al. | 455/326 |
| 2005/0242984 A1 * | 11/2005 | Waters | G01S 7/022 |
| | | | 342/52 |
| 2007/0207763 A1 | 9/2007 | Bollenbeck et al. | |
| 2009/0065696 A1 * | 3/2009 | Mann et al. | 250/339.06 |

OTHER PUBLICATIONS

PCT International Search Report mailed Jan. 19, 2012 in corresponding International Application No. PCT/EP2011/065129.
Chinese Office Action dated Mar. 3, 2015 in corresponding Chinese Patent Application No. 201180056652.1.

* cited by examiner

METHOD AND DEVICE FOR PROCESSING SIGNALS BASED ON TRANSMISSION MIXER, FREQUENCY MULTIPLIER, AND SUBHARMONIC MIXING

CROSS REFERENCE TO RELATED APPLICATIONS

This application is the U.S. national stage of International Application No. PCT/EP2011/065129, filed Sep. 1, 2011 and claims the benefit thereof. The International Application claims the benefit of German Application No. 102010041372.0 filed on Sep. 24, 2010, both applications are incorporated by reference herein in their entirety.

BACKGROUND

Described below are a method and device for processing signals.

To generate and receive high-frequency signals one of the following systems is predominantly used:

A system with separate transmitting and receiving sections generates and modulates the high-frequency signals by the transmitting section and amplifies, filters, mixes, and demodulates received signals with the aid of a separately implemented receiving section. Transmitting and receiving sections may be equipped with different antennae, or may use a common antenna by way of a transmitting/receiving coupler. Such a system is frequently excessively complex and requires a plurality of component elements to be put into effect. For example, component parts which are complex to assemble and which are typically connected in what is referred to as a chip & wire construction are required in order to generate and receive high frequencies.

A further system uses a transmission mixer, which allows for the simultaneous transmission and reception of high-frequency signals. In this situation, the transmission signal also serves as a local oscillator signal for the step-down conversion of the received signals.

It is of disadvantage that with existing systems a high-frequency signal can only be generated and processed with substantial effort.

SUMMARY

An aspect of the method is to avoid the disadvantage referred to heretofore and, in particular, to provide a solution which allows for a simple and economical system for generating and receiving high-frequency signals.

Described below is a method for processing signals
  wherein an input signal is routed from a first component part to a second component; and
  wherein the second component multiplies the frequency of the received signal by at least one component having a non-linear characteristic curve.

The first and second components take on different functions, but may be combined separately or jointly in one physical unit.

In this situation it is of advantage for the first component, among other things, to provide the functionality for the forwarding of the input signal, and for the second component to multiply the frequency of the forwarded signal in an efficient manner. Any attenuation losses of the first component can be compensated, for example, by the input signal exhibiting a sufficiently high signal strength. The approach allows, for example, for a tripling or five-fold increase in the frequency of the input signal. The provision of the input signal and (see hereinafter) processing of the received signal provided by the second component can therefore take place in an appreciably lower frequency range.

One development is that the first component is a transmission mixer.

The transmission mixer routes (transmits) the input signal to the second component and has, e.g., in the opposite direction, i.e. for signals which are provided by the second component, a step-down conversion or step-down mixing functionality.

Another embodiment involves
  the frequency-multiplied signal provided by the second component being emitted via an antenna,
  wherein a signal is received via the antenna, and the received signal is mixed subharmonically by the second component and transmitted to the first component.

Accordingly, the second component provides a frequency-multiplying functionality in one direction. In the opposite direction the second component provides a subharmonic mixing functionality. Accordingly, signals received by the second component can be transformed into a frequency range which lies perceptibly below the frequency of the signal emitted by the antenna. The (further) processing of the received signal is therefore made perceptibly easier.

In particular, one development involves the received signal being subharmonically mixed by the second component and a signal with the frequency $$f_2 - 2f_i$$

being forwarded to the first component, wherein
  $f_2$ is the frequency of the signal received by the second component, and
  $f_i$ is the frequency of the signal provided to the second component.

One development is also that the signal received from the second component is step-down-mixed by the first component.

A further development is that, after the step-down mixing, a signal is provided by the first component with the frequency $$f_3 - f_i$$

wherein
$f_i$ designates the frequency of the input signal or, respectively, the frequency of the signal provided to the second component, and
$f_3$ designates the frequency of the signal which was mixed subharmonically by the second component and transmitted to the first component.

Within the framework of an additional development, the step-down-mixed signal is processed and, on the basis of the step-down-mixed signal, an item of information contained in the received signal can be detected.

A next development involves the frequency of the signal received by the first component being multiplied by the second component, in accordance with a factor $$2n-1, n=1, 2, 3, \ldots$$

A device for processing signals includes a first component, which is connected to a second component, where the second component exhibits at least one component part with a non-linear characteristic curve, on the basis of which the frequency of a signal received from the component can be multiplied. In particular, the first component may be a transmission mixer.

In this situation it may be noted that, in particular, the preceding versions apply correspondingly to this device, and, respectively, the following versions may also be applied to the method as explained.

One embodiment is that the device may be applied in conjunction with Doppler or radar sensors.

In particular, the proposed solution may be used in order to determine information relating to objects arranged in a radiation emission direction, such as distance, speed etc.

It is also possible for the solution presented here to be used for communication or, respectively, data exchange between systems of the same type. For example, provision can be made for a point-to-point or a point-to-multipoint communication link by utilizing the described approach.

In one embodiment, the component part with the non-linear characteristic curve includes two anti-parallel connected diodes. A next embodiment is that the diodes are tuning diodes or Schottky diodes.

Also an embodiment is that the first component and/or the second component is designed in PCB technology, in thin-film technology, in thick-film technology, or as an integrated circuit.

In a development, the second component includes at least one filter, in particular at least one high-pass filter and at least one low-pass filter.

An additional embodiment is that the at least one non-linear component part of the second component is connected via the low-pass filter to the first component, and in that the at least one non-linear component part is connected via the high-pass filter directly or indirectly to an antenna.

Furthermore, a communications system or a radar system is proposed, comprising at least one of the devices described herein.

BRIEF DESCRIPTION OF THE DRAWINGS

Exemplary embodiments are presented and explained hereinafter on the basis of the accompanying drawings of which.

DETAILED DESCRIPTION OF THE PREFERRED EMBODIMENT

Figure 1:
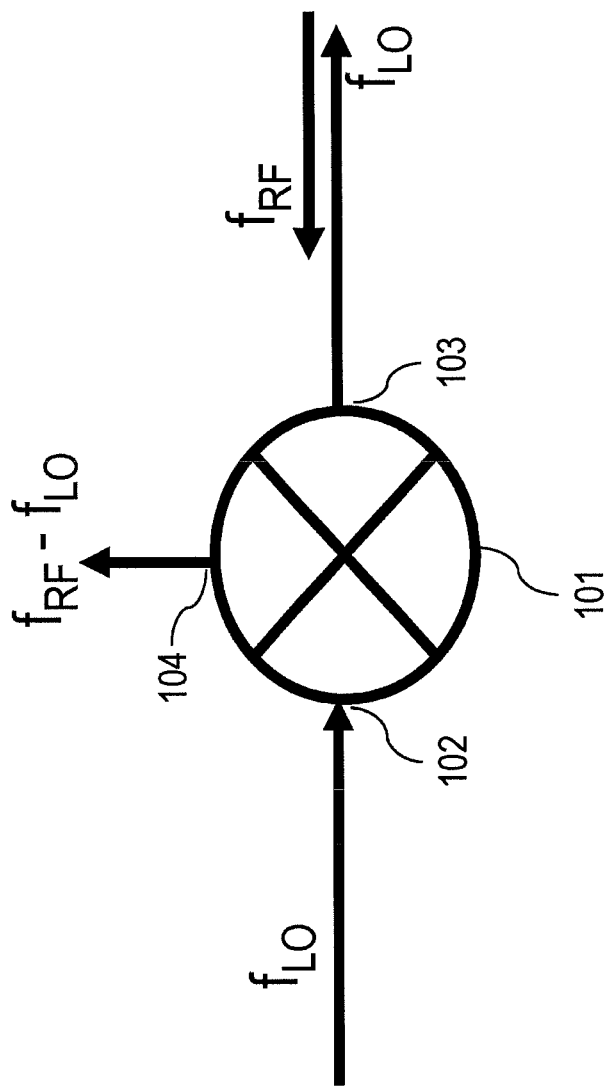
FIG. 1 is a schematic block diagram providing a representation of a transmitting mixer.

Reference will now be made in detail to the preferred embodiments, examples of which are illustrated in the accompanying drawings, wherein like reference numerals refer to like elements throughout.

A concept is proposed which can be easily realized and allows for low costs in respect of the manufacturing steps involved.

In particular, for this purpose, a first component and a second component are connected to one another.

The first component is a transmitting mixer. The transmitting mixer may be operated as a step-up or step-down transformer. For the present solution, the transmitting mixer may be used as a step-down transformer.

FIG. 1 shows a transmitting mixer 101 with a connection 102 and a connection 103. Applied to the connection 102 is a signal with a frequency $f_{LO}$ (this is, for example, a frequency which can also be used by a local oscillator), which is output via the transmitting mixer 101 at the connection 103. For example, a reflected signal with a frequency $f_{RF}$ is received at the connection 103. The transmitting mixer 101 provides a difference signal with the frequency $f_{RF}-f_{LO}$ at an output 104.

It may additionally be mentioned that the transmitting mixer 101 can be lossy, i.e. that the signal which leaves the transmitting mixer 101 at the connection 103 can be attenuated in relation to the signal which is applied to the connection 102.

The second component can on the one hand be operated as a frequency multiplier, e.g. as a frequency tripler, and, on the other, as a subharmonic mixer.

The second component may, for example, exhibit an anti-parallel connected diode pair, exhibiting a cubic current/voltage characteristic curve. Such a characteristic curve can be efficiently used to produce a (sinusoidal) signal with a frequency $3f$ from a sinusoidal signal with a frequency f.

Figure 2:
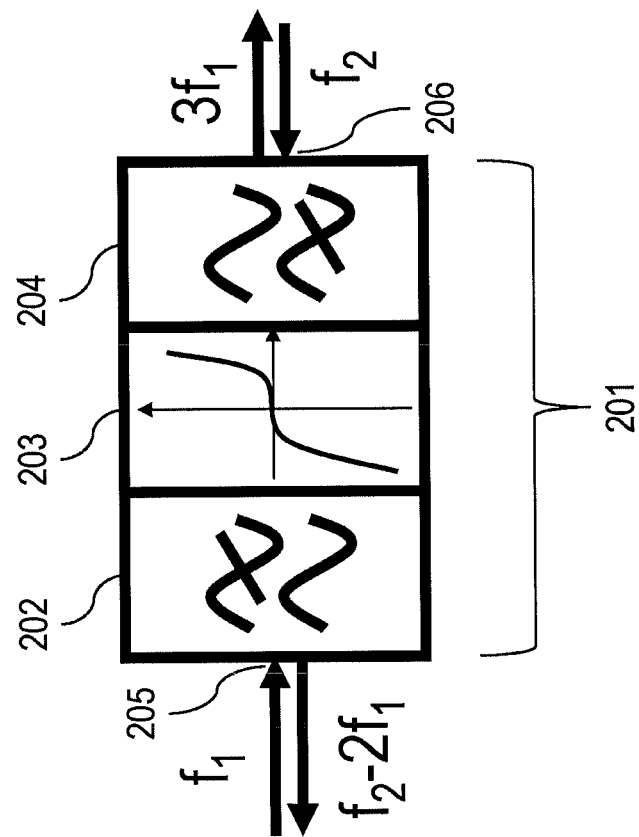
FIG. 2 is a schematic block diagram for a structure of a second component comprising a filter, an anti-parallel connected diode pair with a cubic current/voltage characteristic curve, and a further filter.

FIG. 2 shows a diagrammatic layout of such a second component 201, comprising a filter 202, an anti-parallel connected diode pair 203 with a cubic current/voltage characteristic curve, and a filter 204. The filter 202 is connected via the anti-parallel-connected diodes 203 to the filter 204. The second component 201 exhibits a connection 205 at the filter 202, and a connection 206 at the filter 204.

Furthermore, the second component 201 is designed in such a way that it also takes effect as a (subharmonic) mixer. To do this, a signal with high capacity and a frequency $f_1$ is applied to the connection 205, and a signal with a frequency $f_2 \sim 3f_i$ is applied to the connection 206. The cubic characteristic curve of the anti-parallel diode pair 203 has the effect of producing frequency portions with the frequency $f_{intern}=f_2-2f_i$. With the appropriate selection of the filters 202, 204 involved, this signal can emerge unimpeded at the connection 205.

In general, the second component can be designed in the direction from the connection 206 to the connection 205 in such a way that a signal is provided at the connection 205, which in particular exhibits the difference frequency from $f_2$ and twice the frequency $f_1$.

Filter 202 may include a low-pass filter and filter 204 as a high-pass filter.

Figure 3:
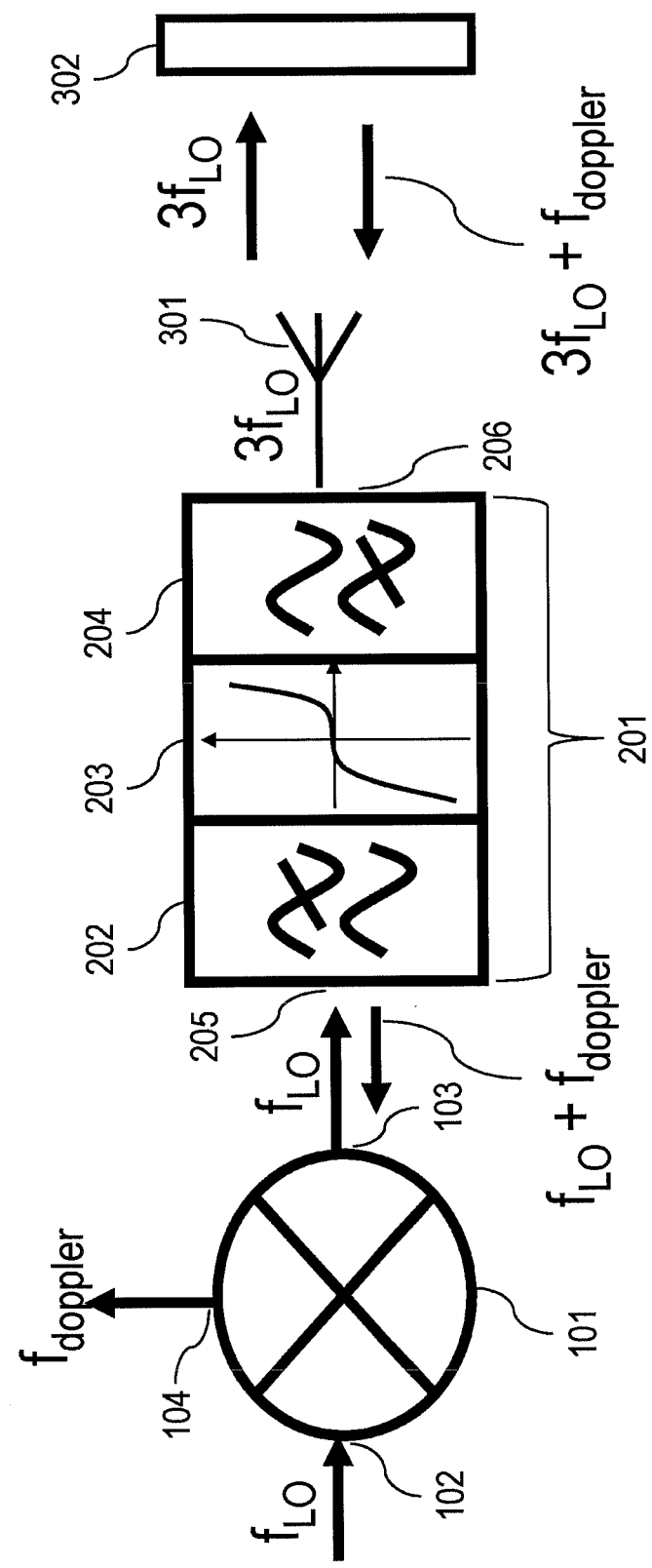
FIG. 3 is a schematic block diagram of an interconnection of the first component and the second component.

FIG. 3 shows an interconnection of the first component 101 and the second component 201. Such a combination can be used, for example, in a Doppler radar.

A signal with a frequency $f_{LO}$ is applied to the connection 102 of the transmitting mixer 101, passes through the transmission mixer 101 with slight attenuation and arrives at the connection 205 of the second component 201. The second component 201 triples the frequency of this signal and therefore provides a signal with the frequency $3f_{LO}$ at the connection 206, the signal being emitted via an antenna 301 connected to the connection 206. The signal thus emitted strikes an object 302, wherein a part of the emitted signal is reflected with the frequency $3f_{LO}+f_{doppler}$, is detected by the antenna 301, and is forwarded to the connection 206 of the second component 201. This signal is subharmonically mixed in the second component 201 and converted into a signal with the frequency $f_{LO}+f_{doppler}$, which is forwarded to the transmission mixer 101 via the connection 205. The transmitting mixer 101 provides a signal with the frequency $f_{doppler}$ at its output 104, after a frequency conversion. On the basis of this frequency $f_{doppler}$ it is possible, for example, to determine the speed of the object 302.

The signal with the frequency $f_{LO}$, which is provided at the input 102, may exhibit a sufficiently high output such that, despite attenuation by the first component 101, the second component 201 can be operated at its working point.

The proposed solution can be used, for example, in conjunction with Doppler or FMCW radar sensors (FMCW=Frequency Modulated Continuous Wave), with which a signal is to be emitted and received at the same time. In particular, the approach is suited to use with radar sensors at very high frequencies, since it is specifically at high frequencies that a generation and amplification of frequencies is very much more difficult to master than at low frequencies. Thus, the solution presented advantageously shifts the frequency generation to a third of the actual transmission frequency. Reception of the signals is simplified accordingly, since no amplifier is required in the reception path.

The circuit can be used to particular advantage if the transmission frequency f of the radar is selected in such a way that the frequency f/3 can be generated with adequately high output and, respectively, in a cost-effective manner.

The solution presented can also be used in communications systems, as well as to measure the distance interval between two systems of the same type.

The combination of first and second components, in particular the second component, can be designed or manufactured in PCB technology or alternative construction techniques, such as thin film, thick layer, or even as an integrated circuit.

The filters of the second component can be configured in such a way that they function as adjustment element(s). Moreover, the filter can be configured in such a way that undesirable mixed products (frequencies) are suppressed. This could, for example, simplify a radio license for corresponding systems.

By way of example, the anti-parallel arrangement of two diodes for the provision of the cubic current/voltage characteristic curve is cited above. As an alternative, another non-linear component part may also be used instead of the diode(s). For example, varistors or capacitance diodes (varactors, tuning diodes) may be used. It is also possible for Schottky diodes (e.g. flip-chop Schottky diodes) to be used. Combinations of the component parts referred to here are also possible.

Aside from the design of the second component as a frequency tripler, it may also be dimensioned, with suitable non-linear component parts, as a frequency five-fold amplifier. In this case, use is not made of the coefficient of the cubic term $x^3$ of the Taylor series of the non-linearity used, but instead of the coefficient of the term $x^5$. The intermediate frequency used may still at all times lie in the range of the input frequency. The same applies accordingly to systems with a multiplication factor of 2n−1 (where n=1, 2, ... ).

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A method for processing signals, comprising:
   routing an input signal from a first component, providing a transmission mixer, to a second component; and
   multiplying a frequency of the routed signal by a non-linear characteristic curve in at least one component part of the second component,
   wherein the second component triples the frequency of the routed signal at a connection to a high-pass filter.

2. The method as claimed in claim 1, further comprising:
   outputting a frequency-multiplied signal provided by the second component via an antenna;
   receiving an external signal by the antenna;
   subharmonically mixing the external signal in the second component to produce a subharmonically mixed signal; and
   transmitting the subharmonically mixed signal to the first component.

3. The method as claimed in claim 2, wherein the subharmonically mixed signal produced by the second component and transmitted to the first component has a frequency $f_2-2f_1$, where $f_2$ is an external signal frequency of the external signal, and $f_1$ is an input signal frequency of the input signal provided to the second component by the first component.

4. The method as claimed in claim 3, further comprising step-down mixing by the first component of the subharmonically mixed signal transmitted from the second component to the first component.

5. The method as claimed in claim 4, further comprising, after the step-down mixing, providing by the first component a step-down mixed signal with the frequency $f_3-f_1$, where $f_1$ is the input signal frequency, and $f_3$ is a subharmonically mixed signal frequency of the subharmonically mixed signal transmitted by the second component to the first component.

6. The method as claimed in claim 5, further comprising processing the step-down mixed signal to detect an item of information contained in the external signal based on the step-down mixed signal.

7. The method as claimed in claim 6, wherein the subharmonically mixed signal frequency of the subharmonically mixed signal is multiplied by the second component according to a factor 2n−1, where n=1, 2, 3, ....

8. A device for processing signals, comprising:
   a first component providing a transmission mixer and receiving an input signal; and
   a second component, connected to the first component, having at least one component part with a non-linear characteristic curve based on which an input signal frequency of the input signal received by the first component can be multiplied,
   wherein the second component triples the frequency of the input signal at a connection to a filter.

9. The device as claimed in claim 8, installed in one of a Doppler sensor and a radar sensor.

10. The device as claimed in claim 8, wherein the at least one component part with the non-linear characteristic curve comprises two anti-parallel connected diodes.

11. The device as claimed in claim 10, wherein each of the two anti-parallel connected diodes is of a tuning diode and a Schottky diode.

12. The device as claimed in claim 11, wherein at least one of the first component and the second component comprises at least one of a printed circuit board, thin-film technology, thick-film technology and an integrated circuit.

13. The device as claimed in claim 11, wherein the second component comprises at least one high-pass filter and at least one low-pass filter.

14. The device as claimed in claim 13, wherein the device is connected to an antenna, and
   wherein the at least one component part of the second component is connected via the low-pass filter to the first component and via the high-pass filter directly or indirectly to the antenna.

* * * * *